United States Patent
Shirakawa et al.

(10) Patent No.: US 7,599,203 B2
(45) Date of Patent: Oct. 6, 2009

(54) POWER SEMICONDUCTOR DEVICE

(75) Inventors: Shinya Shirakawa, Tokyo (JP);
Masahiro Kato, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 302 days.

(21) Appl. No.: 11/619,807

(22) Filed: Jan. 4, 2007

(65) Prior Publication Data
US 2008/0030913 A1    Feb. 7, 2008

(30) Foreign Application Priority Data
Jul. 18, 2006   (JP)   ............... 2006-195585

(51) Int. Cl.
*H02M 7/5387* (2007.01)
(52) U.S. Cl. .................... 363/132; 363/56.05
(58) Field of Classification Search ............ 363/16–20, 363/37, 41, 44, 55, 56.05, 65, 68, 89, 98, 363/132, 135
See application file for complete search history.

(56) References Cited
U.S. PATENT DOCUMENTS
5,055,990 A * 10/1991 Miki et al. .............. 363/56.05

6,232,654 B1   5/2001  Nagase

FOREIGN PATENT DOCUMENTS

| JP | 3-136412    | 6/1991 |
| JP | 8-32021     | 2/1996 |
| JP | 2000-82775  | 3/2000 |
| JP | 2004-112999 | 4/2004 |

\* cited by examiner

*Primary Examiner*—Rajnikant B Patel
(74) *Attorney, Agent, or Firm*—Oblon, Spivak, McClelland, Maier & Neustadt, L.L.P.

(57) ABSTRACT

A power semiconductor device M includes: first and second frames for feeding unipolar power from outside; first and second switching units which are series-connected between the first and second frames; an output frame for outputting AC power which is generated by conduction and shutoff of each switching unit to outside; a connecting wire for electrically connecting at least one pair of the first frame and the first switching unit, the first switching unit and the output frame, the output frame and the second switching unit, and the second switching unit and the second frame; a third frame which is arranged close to the output frame; and a branching wire for electrically connecting the first switching unit or the second switching unit to the third frame, whereby sufficiently suppressing surge voltage which takes place within the module even using an external snubber circuit.

6 Claims, 4 Drawing Sheets

POWER SEMICONDUCTOR DEVICE

BACKGROUND OF THE INVENTION

1. Field of the Invention

The present invention relates to a power semiconductor device, which is applicable to, for example, general-purpose inverters or power converters.

2. Description of the Related Art

FIG. 7 is a plan view showing an example of an internal configuration of a conventional power semiconductor module. FIG. 8 is a circuit diagram relevant to a phase-W circuit of the power semiconductor module of FIG. 7. Here, exemplified is a case of converting unipolar power, which is rectified from AC power, into three-phase AC power (phase-U, phase-V, phase-W).

The power semiconductor module M is provided with frames F1 to F5 made of electrically conductive material on an electrically insulating substrate. The frames F1 and F5 are fed with external unipolar power. For example, a terminal P of the frame F1 is connected with a positive line of an AC power rectifying circuit, while a terminal N of the frame F5 is connected with a negative line of the AC power rectifying circuit.

A terminal W of the frame F2 outputs the phase-W of AC power to an external circuit. A terminal V of the frame F3 outputs the phase-V of AC power to an external circuit. A terminal U of the frame F4 outputs the phase-U of AC power to an external circuit.

On the frame F1, mounted are switching devices S4 to S6, such as IGBT (Insulated Gate Bipolar Transistor), and flywheel diodes D4 to D6. The collectors of the switching devices S4 to S6 and the cathodes of the diodes D4 to D6 are electrically connected to the frame F1.

The emitter of the switching device S4 and the anode of the diode D4 are connected to each other using a short connecting wire, and also to the frame F4 using a relatively longer connecting wire L4. Likewise, the emitter of the switching device S5 and the anode of the diode D5 are connected to each other using a short connecting wire, and also to the frame F3 using a relatively longer connecting wire L5. Further, the emitter of the switching device S6 and the anode of the diode D6 are connected to each other using a short connecting wire, and also to the frame F2 using a relatively longer connecting wire L6.

Meanwhile, on the frame F2, mounted are a switching device S3, such as IGBT, and a flywheel diodes D3. The collector of the switching device S3 and the cathode of the diode D3 are electrically connected to the frame F2. The emitter of the switching device S3 and the anode of the diode D3 are connected to each other using a short connecting wire, and also to the frame F5 using a relatively longer connecting wire L3.

On the frame F3, mounted are a switching device S2, such as IGBT, and a flywheel diodes D2. The collector of the switching device S2 and the cathode of the diode D2 are electrically connected to the frame F3. The emitter of the switching device S2 and the anode of the diode D2 are connected to each other using a short connecting wire, and also to the frame F5 using a relatively longer connecting wire L2.

On the frame F4, mounted are a switching device S1, such as IGBT, and a flywheel diodes D1. The collector of the switching device S1 and the cathode of the diode D1 are electrically connected to the frame F4. The emitter of the switching device S1 and the anode of the diode D1 are connected to each other using a short connecting wire, and also to the frame F5 using a relatively longer connecting wire L1.

Incidentally, for avoiding complexity of the drawing, illustration of the respective gate of the respective IGBT and the respective wire connected with each gate is omitted.

In this configuration, the switching devices S6 and S3 are series-connected between the frames F1 and F5, which are fed with unipolar power, to control the phase-W of AC power. The switching devices S5 and S2 are series-connected to control the phase-V of AC power. The switching devices S4 and S1 are series-connected to control the phase-U of AC power.

A snubber circuit for suppressing surge voltage which may occur in the outputted AC power, is externally connected to the power semiconductor module M. The snubber circuit is typically composed of capacitor, diode, resistor, etc.

Referring to the phase-W of AC power, for example, as shown in FIG. 8, a snubber circuit SN1 is connected between the terminals P and W, and a snubber circuit SN2 is connected between the terminals N and W. Alternatively to the snubber circuits SN1 and SN2, another snubber circuit SN3 may be connected between the terminals P and N.

For the other phase-U and phase-V of AC power, the snubber circuits SN1 and SN2, or SN3 are connected like phase-W.

In such an internal configuration of the above-described power semiconductor module M, since the frames and the semiconductor devices are mutually connected using the connecting wires L1 to L6, total length of the wiring path where each of main circuit current flows is likely to be relatively larger. Hence, due to inductance of the wiring path, relatively higher surge voltage easily takes place during switching operation of the switching devices S1 to S6. Such a higher surge voltage may increase switching loss of the switching devices S1 to S6, or cause breakage of the devices.

As shown in FIG. 8, external connection of the snubber circuits SN1 and SN2, or SN3 with the power semiconductor module M can suppress the surge voltage to some level.

However, in a case of the conventional power semiconductor module M having remarkably larger inductances of the connecting wires L1 to L6, it is difficult for the external snubber circuit to sufficiently suppress surge voltage which takes place within the module.

The related prior arts are listed as follows: Japanese Patent Unexamined Publications (kokai) JP-2000-82775 A1, JP-3-136412(1991) A1, JP-8-32021(1996) A1, JP-2004-112999 A1.

SUMMARY OF THE INVENTION

An object of the present invention is to provide a power semiconductor device which can sufficiently suppress surge voltage which takes place within the module even using an external snubber circuit.

To achieve the above object, a power semiconductor device according to the present invention, includes:

first and second frames for feeding unipolar power from outside;

first and second switching units which are series-connected between the first and second frames;

an output frame for outputting AC power which is generated by conduction and shutoff of each switching unit to outside;

a connecting wire for electrically connecting at least one pair of the first frame and the first switching unit, the first switching unit and the output frame, the output frame and the second switching unit, and the second switching unit and the second frame;

a third frame which is arranged close to the output frame; and a branching wire for electrically connecting the first switching unit or the second switching unit to the third frame.

Further, a power semiconductor device according to the present invention, includes:

first and second frames for feeding unipolar power from outside;

first and second switching units which are series-connected between the first and second frames;

an output frame for outputting AC power which is generated by conduction and shutoff of each switching unit to outside;

a connecting wire for electrically connecting at least one pair of the first frame and the first switching unit, the first switching unit and the output frame, the output frame and the second switching unit, and the second switching unit and the second frame;

a third frame which is arranged close to one of the first and second frames; and a branching wire for electrically connecting the output frame and the third frame.

Furthermore, a power semiconductor device according to the present invention, includes:

first and second frames for feeding unipolar power from outside;

first and second switching units which are series-connected between the first and second frames;

an output frame for outputting AC power which is generated by conduction and shutoff of each switching unit to outside;

a connecting wire for electrically connecting at least one pair of the first frame and the first switching unit, the first switching unit and the output frame, the output frame and the second switching unit, and the second switching unit and the second frame;

a third frame which is arranged close to one of the first and second frames; and a branching wire for electrically connecting the other of the first and second frames to the third frame.

It is preferable in the present invention that a snubber circuit is connected between the output frame and the third frame.

It is preferable in the present invention that a snubber circuit is connected between the one of the first and second frames and the third frame.

According to the present invention, an additional third frame is arranged separately from the output frame and the first and second frames and close thereto to connect a branching wire which is separate from the connecting wire with the third frame. Then, by connecting the third frame with an external snubber circuit, wiring length and loop area of the closed loop circuit including the snubber circuit can be reduced, thereby improving the effect of the snubber circuit for suppressing surge voltage.

DETAILED DESCRIPTION OF THE PREFERRED EMBODIMENTS

This application is based on an application No. 2006-195585 filed Jul. 18, 2006 in Japan, the disclosure of which is incorporated herein by reference.

Hereinafter, preferred embodiments will be described with reference to drawings.

Embodiment 1

Figure 1:
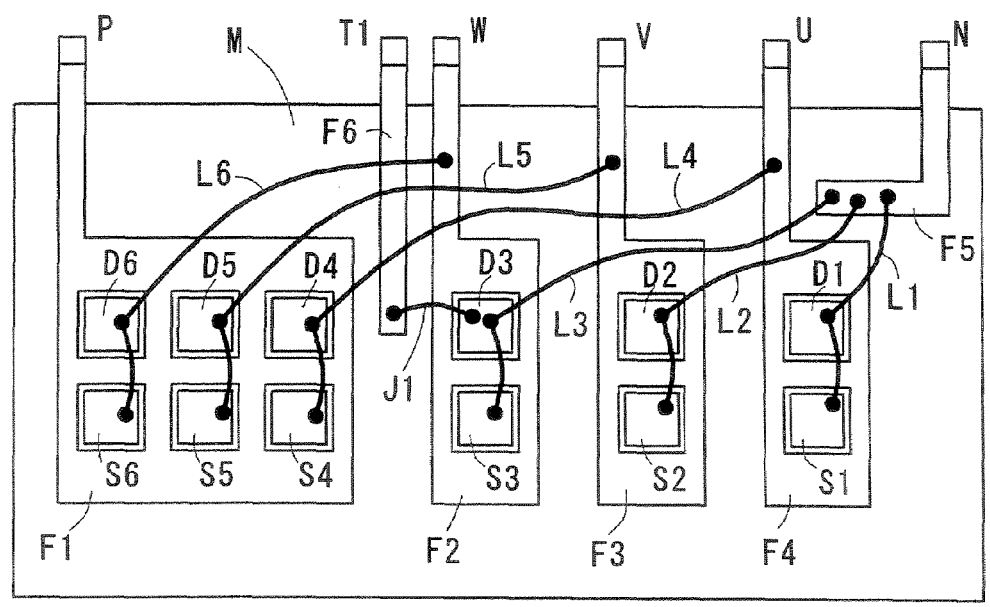
FIG. 1 is a plan view showing an example of an internal configuration of a power semiconductor module according to a first embodiment of the present invention.
Figure 2:
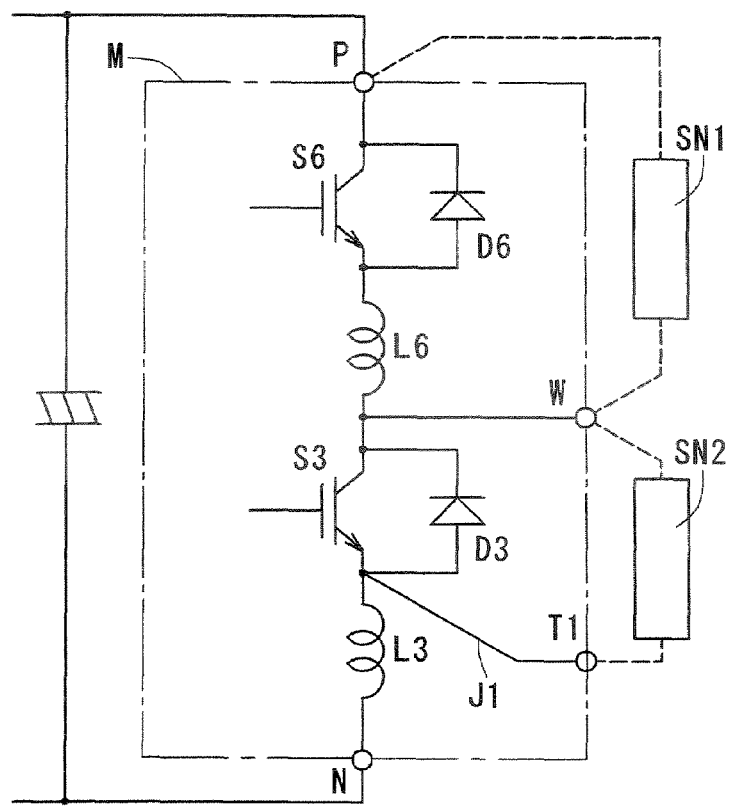
FIG. 2 is a circuit diagram relevant to a phase-W circuit of the power semiconductor module of FIG. 1.

FIG. 1 is a plan view showing an example of an internal configuration of a power semiconductor module according to a first embodiment of the present invention. FIG. 2 is a circuit diagram relevant to a phase-W circuit of the power semiconductor module of FIG. 1. Here, exemplified is a case of converting unipolar power, which is rectified from AC power, into three-phase AC power (phase-U, phase-V, phase-W).

The power semiconductor module M is provided with frames F1 to F5 made of electrically conductive material on an electrically insulating substrate, and an additional frame F6 is arranged close to the frame F2. The frames F1 and F5 are fed with external unipolar power. For example, a terminal P of the frame F1 is connected with a positive line of an AC power rectifying circuit, while a terminal N of the frame F5 is connected with a negative line of the AC power rectifying circuit.

A terminal W of the frame F2 outputs the phase-W of AC power to an external circuit. A terminal V of the frame F3 outputs the phase-V of AC power to an external circuit. A terminal U of the frame F4 outputs the phase-U of AC power to an external circuit.

On the frame F1, mounted are switching devices S4 to S6, such as IGBT (Insulated Gate Bipolar Transistor), and flywheel diodes D4 to D6. The collectors of the switching devices S4 to S6 and the cathodes of the diodes D4 to D6 are electrically connected to the frame F1.

The emitter of the switching device S4 and the anode of the diode D4 are connected to each other using a short connecting wire, and also to the frame F4 using a relatively longer connecting wire L4. Likewise, the emitter of the switching device S5 and the anode of the diode D5 are connected to each other using a short connecting wire, and also to the frame F3 using a relatively longer connecting wire L5. Further, the emitter of the switching device S6 and the anode of the diode D6 are connected to each other using a short connecting wire, and also to the frame F2 using a relatively longer connecting wire L6.

Meanwhile, on the frame F2, mounted are a switching device S3, such as IGBT, and a flywheel diodes D3. The collector of the switching device S3 and the cathode of the diode D3 are electrically connected to the frame F2. The emitter of the switching device S3 and the anode of the diode D3 are connected to each other using a short connecting wire, and also to the frame F5 using a relatively longer connecting wire L3.

On the frame F3, mounted are a switching device S2, such as IGBT, and a flywheel diodes D2. The collector of the switching device S2 and the cathode of the diode D2 are electrically connected to the frame F3. The emitter of the switching device S2 and the anode of the diode D2 are connected to each other using a short connecting wire, and also to the frame F5 using a relatively longer connecting wire L2.

On the frame F4, mounted are a switching device S1, such as IGBT, and a flywheel diodes D1. The collector of the switching device S1 and the cathode of the diode D1 are electrically connected to the frame F4. The emitter of the switching device S1 and the anode of the diode D1 are connected to each other using a short connecting wire, and also to the frame F5 using a relatively longer connecting wire L1.

In this embodiment, the additional frame F6 is electrically connected to the anode of the diode D3 using a branching wire J1 which branches from the connecting wire L3.

Incidentally, for avoiding complexity of the drawing, illustration of the respective gate of the respective IGBT and the respective wire connected with each gate is omitted.

In this configuration, the switching devices S6 and S3 are series-connected between the frames F1 and F5, which are fed with unipolar power, to control the phase-W of AC power. The switching devices S5 and S2 are series-connected to control the phase-V of AC power. The switching devices S4 and S1 are series-connected to control the phase-U of AC power.

In this embodiment, as shown in FIG. 2, an external snubber circuit SN2 is connected between the terminal W of the frame F2 for outputting the phase-W and a terminal T1 of the additional frame F6. Hence, the snubber circuit SN2 resides in the closed loop circuit including the terminal T1, the frame F6, the branching wire J1, the switching device S3 (diode D3), the frame F2 and the terminal W.

Figure 7:
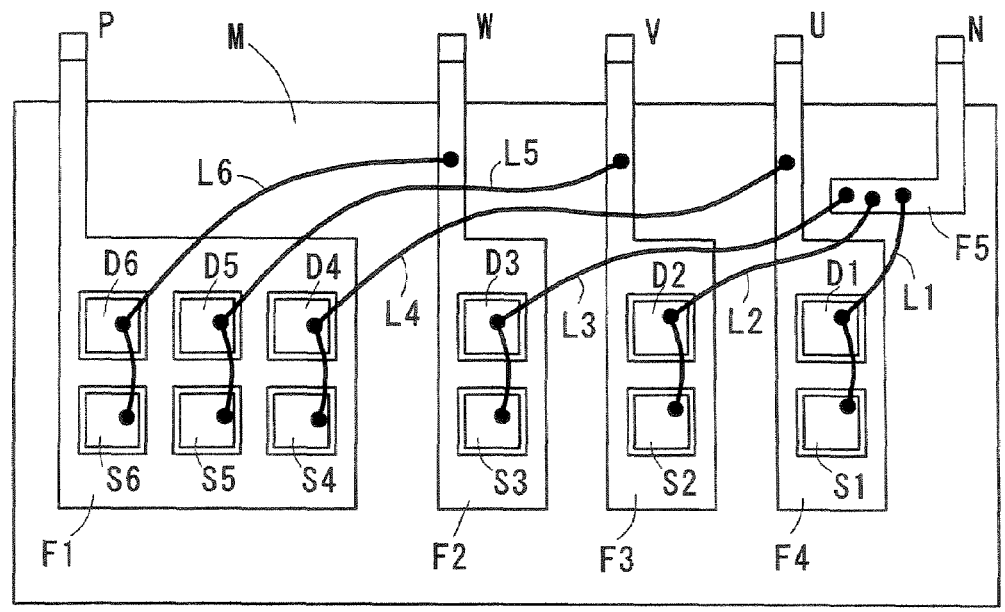
FIG. 7 is a plan view showing an example of an internal configuration of a conventional power semiconductor module.
Figure 8:
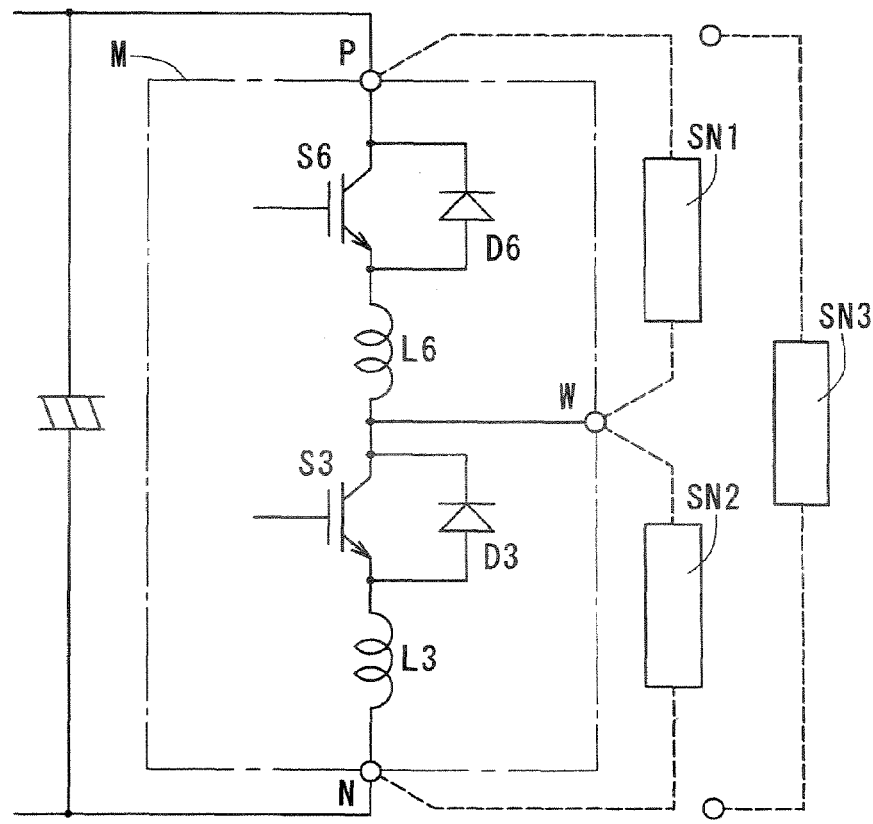
FIG. 8 is a circuit diagram relevant to a phase-W circuit of the power semiconductor module of FIG. 7.

In the conventional power semiconductor module, on the other hand, as shown in FIGS. 7 and 8, the snubber circuit SN2 resides in the closed loop circuit including the terminal N, the frame F5, the connecting wire L3, the switching device S3 (diode D3), the frame F2 and the terminal W.

Therefore, this embodiment can reduce wiring length and loop area of the closed loop circuit including the snubber circuit SN2, thereby improving the effect of the snubber circuit SN2 for suppressing surge voltage.

Here, surge suppression of the phase-W of AC power has been described in detail. Likewise, in case of the phase-U of AC power, an additional frame is arranged close to the frame F4, and a branching wire is connected between the frame and the diode D1, and an external snubber circuit is connected between a terminal of the frame and the terminal U of the frame F4, resulting in the same effect as in phase-W. Moreover, in case of the phase-V of AC power, an additional frame is arranged close to the frame F3, and a branching wire is connected between the frame and the diode D2, and an external snubber circuit is connected between a terminal of the frame and the terminal V of the frame F3, resulting in the same effect as in phase-W.

In the above description, discussed was the closed loop circuit of the snubber circuit SN2 which was connected between the respective frames F2 to F4 for outputting AC power and the frame F5 which is a negative line of unipolar power. Similarly, another closed loop circuit of a snubber circuit SN1 which is connected between the respective frames F2 to F4 and the frame F1 which is a positive line of unipolar power can be improved.

Embodiment 2

Figure 3:
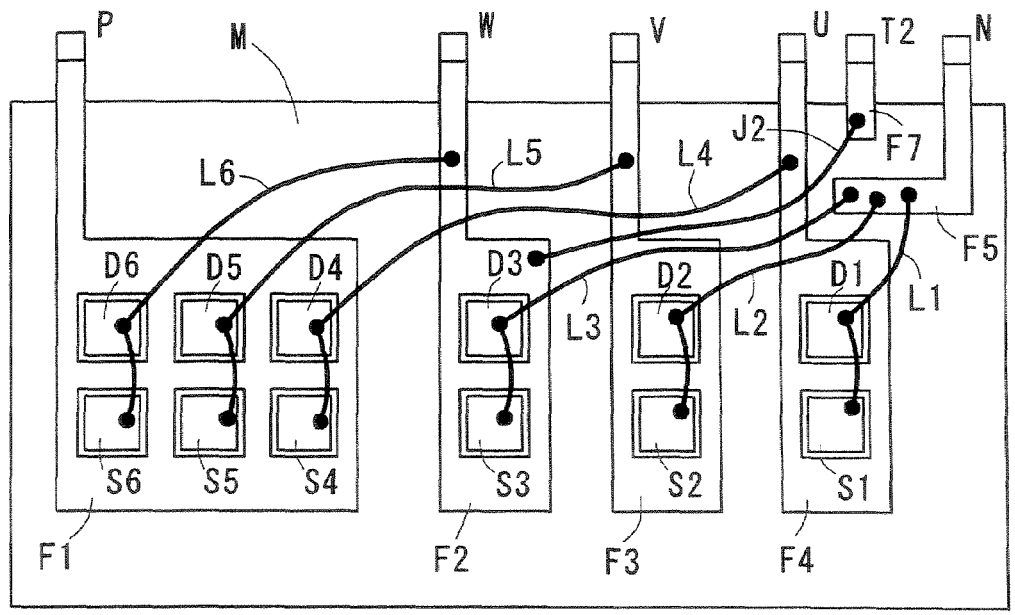
FIG. 3 is a plan view showing an example of an internal configuration of a power semiconductor module according to a second embodiment of the present invention.
Figure 4:
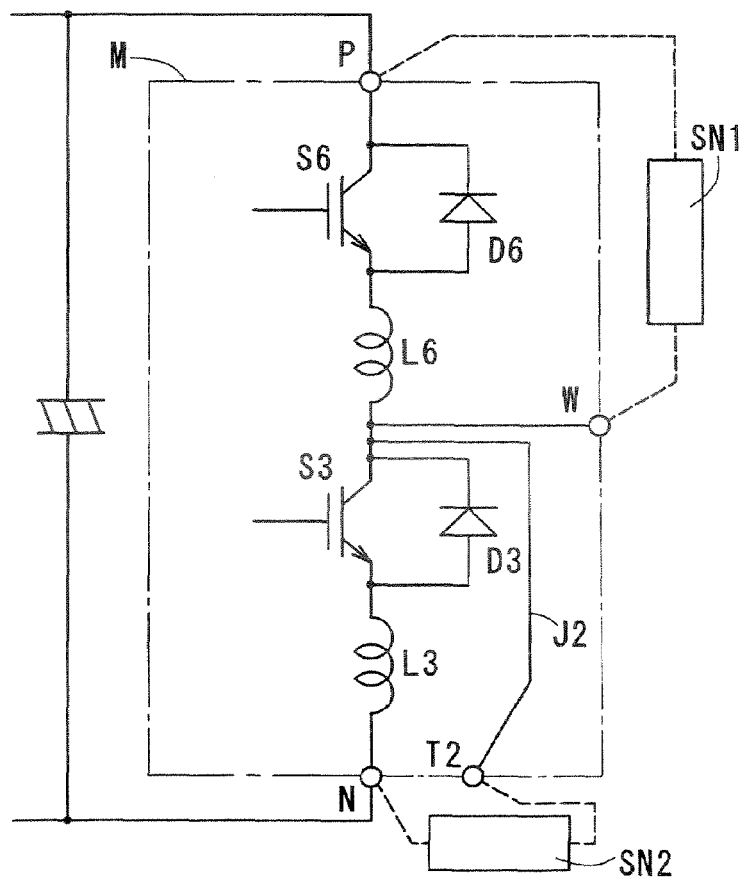
FIG. 4 is a circuit diagram relevant to a phase-W circuit of the power semiconductor module of FIG. 3.

FIG. 3 is a plan view showing an example of an internal configuration of a power semiconductor module according to a second embodiment of the present invention. FIG. 4 is a circuit diagram relevant to a phase-W circuit of the power semiconductor module of FIG. 3. Here, exemplified is a case of converting unipolar power, which is rectified from AC power, into three-phase AC power (phase-U, phase-V, phase-W).

The power semiconductor module M is provided with frames F1 to F5 made of electrically conductive material on an electrically insulating substrate, and an additional frame F7 is arranged close to the frame F5. The frames F1 and F5 are fed with external unipolar power. For example, a terminal P of the frame F1 is connected with a positive line of an AC power rectifying circuit, while a terminal N of the frame F5 is connected with a negative line of the AC power rectifying circuit.

A terminal W of the frame F2 outputs the phase-W of AC power to an external circuit. A terminal V of the frame F3 outputs the phase-V of AC power to an external circuit. A terminal U of the frame F4 outputs the phase-U of AC power to an external circuit.

On the frame F1, mounted are switching devices S4 to S6, such as IGBT, and flywheel diodes D4 to D6. The collectors of the switching devices S4 to S6 and the cathodes of the diodes D4 to D6 are electrically connected to the frame F1.

The emitter of the switching device S4 and the anode of the diode D4 are connected to each other using a short connecting wire, and also to the frame F4 using a relatively longer connecting wire L4. Likewise, the emitter of the switching device S5 and the anode of the diode D5 are connected to each other using a short connecting wire, and also to the frame F3 using a relatively longer connecting wire L5. Further, the emitter of the switching device S6 and the anode of the diode D6 are connected to each other using a short connecting wire, and also to the frame F2 using a relatively longer connecting wire L6.

Meanwhile, on the frame F2, mounted are a switching device S3, such as IGBT, and a flywheel diodes D3. The collector of the switching device S3 and the cathode of the diode D3 are electrically connected to the frame F2. The emitter of the switching device S3 and the anode of the diode D3 are connected to each other using a short connecting wire, and also to the frame F5 using a relatively longer connecting wire L3.

On the frame F3, mounted are a switching device S2, such as IGBT, and a flywheel diodes D2. The collector of the switching device S2 and the cathode of the diode D2 are electrically connected to the frame F3. The emitter of the switching device S2 and the anode of the diode D2 are connected to each other using a short connecting wire, and also to the frame F5 using a relatively longer connecting wire L2.

On the frame F4, mounted are a switching device S1, such as IGBT, and a flywheel diodes D1. The collector of the switching device S1 and the cathode of the diode D1 are electrically connected to the frame F4. The emitter of the switching device S1 and the anode of the diode D1 are connected to each other using a short connecting wire, and also to the frame F5 using a relatively longer connecting wire L1.

In this embodiment, the additional frame F7 is electrically connected to the frame F2 using a branching wire J2.

Incidentally, for avoiding complexity of the drawing, illustration of the respective gate of the respective IGBT and the respective wire connected with each gate is omitted.

In this configuration, the switching devices S6 and S3 are series-connected between the frames F1 and F5, which are fed with unipolar power, to control the phase-W of AC power. The switching devices S5 and S2 are series-connected to control the phase-V of AC power. The switching devices S4 and S1 are series-connected to control the phase-U of AC power.

In this embodiment, as shown in FIG. 4, an external snubber circuit SN2 is connected between the terminal N of the frame F5 and a terminal T2 of the additional frame F7. Hence, the snubber circuit SN2 resides in the closed loop circuit including the terminal T2, the frame F7, the branching wire J2, the switching device S3 (diode D3), the connecting wire L3, the frame F5 and the terminal N.

Therefore, this embodiment can reduce wiring length and loop area of the closed loop circuit including the snubber circuit SN2, thereby improving the effect of the snubber circuit SN2 for suppressing surge voltage.

Here, surge suppression of the phase-W of AC power has been described in detail. Likewise, in case of both the phase-U and the phase-V of AC power, respective additional frames are arranged close to the frame F5, and respective branching wires are connected between the respective frames and the frames F3 and F4, and respective external snubber circuits are connected between each terminal of the respective frames and the terminal N of the frame F5, resulting in the same effect as in phase-W.

In the above description, discussed was the closed loop circuit of the snubber circuit SN2 which was connected between the respective frames F2 to F4 for outputting AC power and the frame F5 which is a negative line of unipolar power. Similarly, another closed loop circuit of a snubber circuit SN1 which is connected between the respective frames F2 to F4 and the frame F1 which is a positive line of unipolar power can be improved.

Embodiment 3

Figure 5:
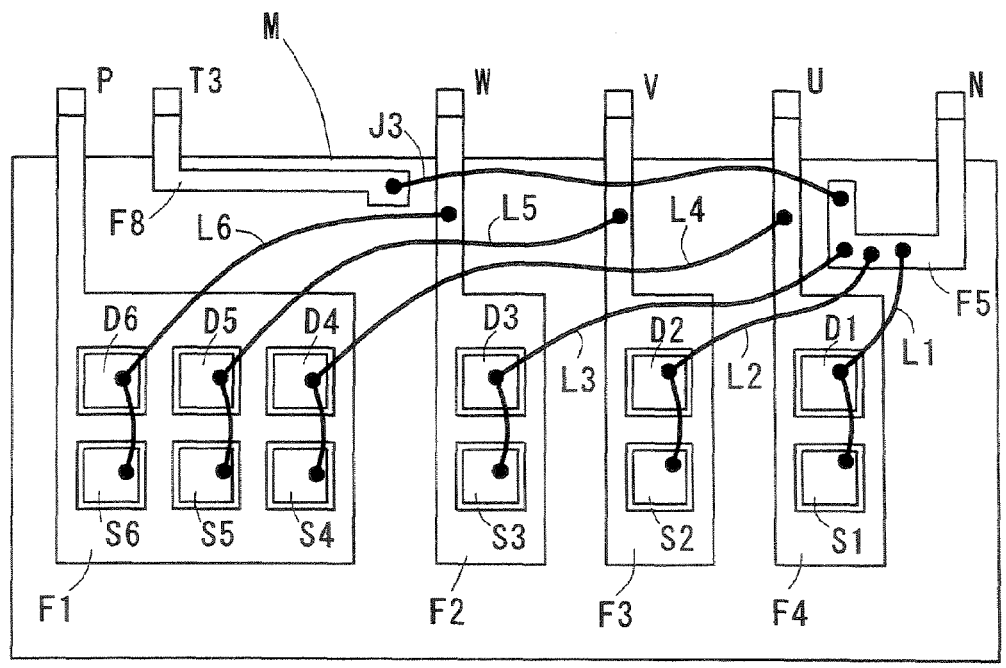
FIG. 5 is a plan view showing an example of an internal configuration of a power semiconductor module according to a third embodiment of the present invention.
Figure 6:
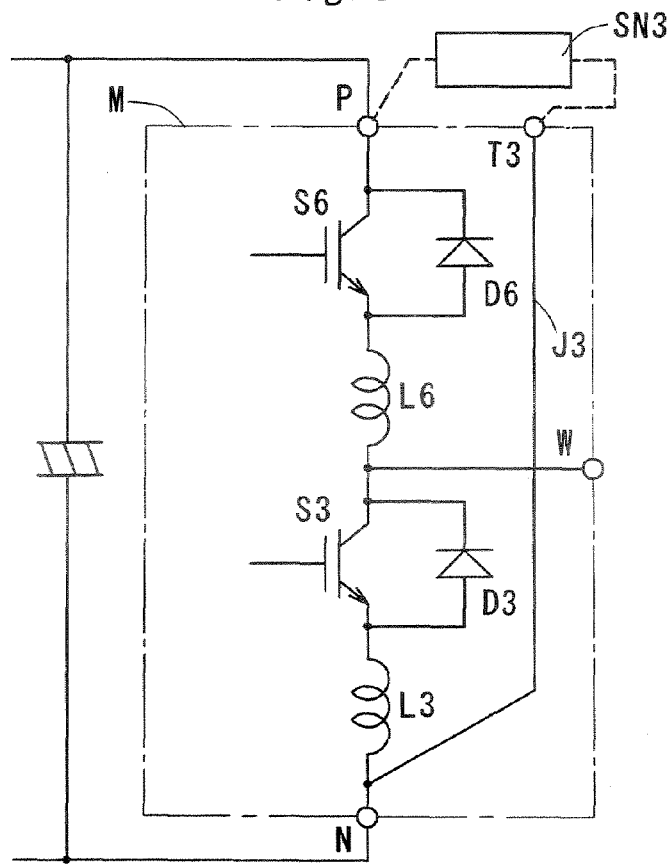
FIG. 6 is a circuit diagram relevant to a phase-W circuit of the power semiconductor module of FIG. 5.

FIG. 5 is a plan view showing an example of an internal configuration of a power semiconductor module according to a third embodiment of the present invention. FIG. 6 is a circuit diagram relevant to a phase-W circuit of the power semiconductor module of FIG. 5. Here, exemplified is a case of converting unipolar power, which is rectified from AC power, into three-phase AC power (phase-U, phase-V, phase-W).

The power semiconductor module M is provided with frames F1 to F5 made of electrically conductive material on an electrically insulating substrate, and an additional frame F8 is arranged close to the frame F1. The frames F1 and F5 are fed with external unipolar power. For example, a terminal P of the frame F1 is connected with a positive line of an AC power rectifying circuit, while a terminal N of the frame F5 is connected with a negative line of the AC power rectifying circuit.

A terminal W of the frame F2 outputs the phase-W of AC power to an external circuit. A terminal V of the frame F3 outputs the phase-V of AC power to an external circuit. A terminal U of the frame F4 outputs the phase-U of AC power to an external circuit.

On the frame F1, mounted are switching devices S4 to S6, such as IGBT, and flywheel diodes D4 to D6. The collectors of the switching devices S4 to S6 and the cathodes of the diodes D4 to D6 are electrically connected to the frame F1.

The emitter of the switching device S4 and the anode of the diode D4 are connected to each other using a short connecting wire, and also to the frame F4 using a relatively longer connecting wire L4. Likewise, the emitter of the switching device S5 and the anode of the diode D5 are connected to each other using a short connecting wire, and also to the frame F3 using a relatively longer connecting wire L5. Further, the emitter of the switching device S6 and the anode of the diode D6 are connected to each other using a short connecting wire, and also to the frame F2 using a relatively longer connecting wire L6.

Meanwhile, on the frame F2, mounted are a switching device S3, such as IGBT, and a flywheel diodes D3. The collector of the switching device S3 and the cathode of the diode D3 are electrically connected to the frame F2. The emitter of the switching device S3 and the anode of the diode D3 are connected to each other using a short connecting wire, and also to the frame F5 using a relatively longer connecting wire L3.

On the frame F3, mounted are a switching device S2, such as IGBT, and a flywheel diodes D2. The collector of the switching device S2 and the cathode of the diode D2 are electrically connected to the frame F3. The emitter of the switching device S2 and the anode of the diode D2 are connected to each other using a short connecting wire, and also to the frame F5 using a relatively longer connecting wire L2.

On the frame F4, mounted are a switching device S1, such as IGBT, and a flywheel diodes D1. The collector of the switching device S1 and the cathode of the diode D1 are electrically connected to the frame F4. The emitter of the switching device S1 and the anode of the diode D1 are connected to each other using a short connecting wire, and also to the frame F5 using a relatively longer connecting wire L1.

In this embodiment, the additional frame F8 is electrically connected to the frame F5 using a branching wire J3.

Incidentally, for avoiding complexity of the drawing, illustration of the respective gate of the respective IGBT and the respective wire connected with each gate is omitted.

In this configuration, the switching devices S6 and S3 are series-connected between the frames F1 and F5, which are fed with unipolar power, to control the phase-W of AC power. The switching devices S5 and S2 are series-connected to control the phase-V of AC power. The switching devices S4 and S1 are series-connected to control the phase-U of AC power.

In this embodiment, as shown in FIG. 6, an external snubber circuit SN3 is connected between the terminal P of the frame F1 and a terminal T3 of the additional frame F8. Hence, the snubber circuit SN3 resides in the closed loop circuit including the terminal T3, the frame F8, the branching wire J3, the pair of switching devices, the frame F1 and the terminal P.

In the conventional power semiconductor module, on the other hand, as shown in FIGS. 7 and 8, the snubber circuit SN3 resides in the closed loop circuit including the terminal N, the frame F5, the pair of switching devices, the frame F1 and the terminal P.

Therefore, this embodiment can reduce wiring length and loop area of the closed loop circuit including the snubber circuit SN3, thereby improving the effect of the snubber circuit SN3 for suppressing surge voltage.

In the above description, discussed was the case where the additional frame F8 was arranged close to the frame F1 which was a positive line of unipolar power, and the snubber circuit SN3 was connected therebetween. Similarly, the other case where an additional frame is arranged close to the frame F5 which is a negative line of unipolar power, and the snubber circuit SN3 is connected therebetween can be improved.

Although the present invention has been fully described in connection with the preferred embodiments thereof and the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A power semiconductor device comprising:
   first and second frames for feeding unipolar power from outside;
   first and second switching units which are series-connected between the first and second frames;
   an output frame for outputting AC power which is generated by conduction and shutoff of each switching unit to outside;
   a connecting wire for electrically connecting at least one pair of the first frame and the first switching unit, the first switching unit and the output frame, the output frame and the second switching unit, and the second switching unit and the second frame;
   a third frame disposed between the first and second switching units and which is arranged close to the output frame; and
   a branching wire for electrically connecting the first switching unit or the second switching unit to the third frame.

2. A power semiconductor device comprising:
   first and second frames for feeding unipolar power from outside;
   first and second switching units which are series-connected between the first and second frames;
   an output frame for outputting AC power which is generated by conduction and shutoff of each switching unit to outside;
   a connecting wire for electrically connecting at least one pair of the first frame and the first switching unit, the first switching unit and the output frame, the output frame and the second switching unit, and the second switching unit and the second frame;
   a third frame which is arranged close to one of the first and second frames; and
   a branching wire for electrically connecting the output frame in series with an external snubber to the third frame.

3. A power semiconductor device comprising:
   first and second frames for feeding unipolar power from outside;
   first and second switching units which are series-connected between the first and second frames;
   an output frame for outputting AC power which is generated by conduction and shutoff of each switching unit to outside;
   a connecting wire for electrically connecting at least one pair of the first frame and the first switching unit, the first switching unit and the output frame, the output frame and the second switching unit, and the second switching unit and the second frame;
   a third frame disposed between the first and second switching units and which is arranged close to one of the first and second frames; and
   a branching wire for electrically connecting the other of the first and second frames to the third frame.

4. The power semiconductor device according to claim 1, wherein a snubber circuit is connected between the output frame and the third frame.

5. The power semiconductor device according to claim 2, wherein a snubber circuit is connected between the one of the first and second frames and the third frame.

6. The power semiconductor device according to claim 3, wherein a snubber circuit is connected between the one of the first and second frames and the third frame.

* * * * *